United States Patent [19]

Davis et al.

[11] Patent Number: 4,717,890
[45] Date of Patent: Jan. 5, 1988

[54] SYMMETRIC LAYOUT FOR QUAD OPERATIONAL AMPLIFIER

[75] Inventors: William F. Davis, Tempe; David M. Susak, Mesa, both of Ariz.

[73] Assignee: Motorola, Inc., Schaumburg, Ill.

[21] Appl. No.: 849,090

[22] Filed: Apr. 7, 1986

[51] Int. Cl.$^4$ .............................................. H03F 3/04
[52] U.S. Cl. ................................... 330/307; 307/310; 330/256; 357/28
[58] Field of Search ............... 330/256, 289, 295, 307; 307/310; 357/28; 29/573, 577 C

[56] References Cited

U.S. PATENT DOCUMENTS 3,714,527  1/1973  Schmidt ................. 357/28

Primary Examiner—James B. Mullins
Attorney, Agent, or Firm—Vincent B. Ingrassia

[57] ABSTRACT

A quad operational amplifier integrated circuit is constructed such that each of the four cells forms a linear array. Devices which must be critically matched in each cell are symmetrically disposed with respect to the power devices of each cell about the same axis of symmetry. In this manner, critical devices will always reside on isothermal contours. To further enhance matching of critical devices, the axis of symmetry may be chosen to be colinear with stress axis of the semiconductor die in which the quad-operational amplifier implemented.

5 Claims, 4 Drawing Figures

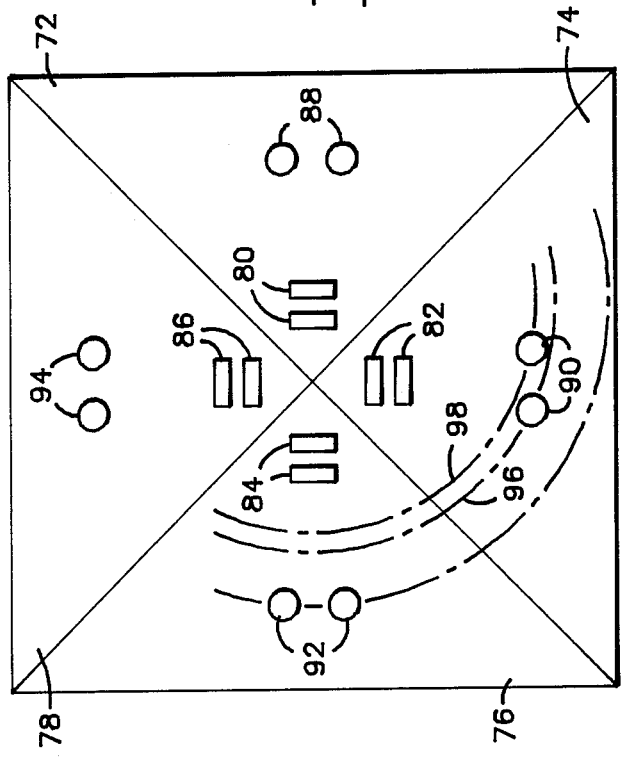
FIG. 3 — PRIOR ART —
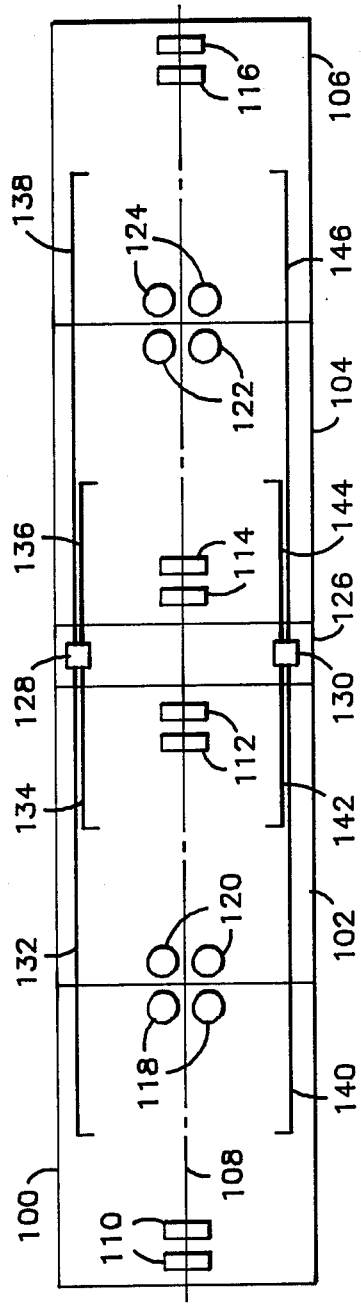
FIG. 4

SYMMETRIC LAYOUT FOR QUAD OPERATIONAL AMPLIFIER

BACKGROUND OF THE INVENTION

This invention relates generally to operational amplifiers, and more particularly to a quad-operational amplifier layout characterized by thermal as well as stress symmetry.

As is well known, the power dissipated by a power device on an integrated circuit, (for example, an output transistor of an operational amplifier) results in the creation of isothermal contours about the power device. Clearly then, any devices in the circuit which must be critically matched (e.g. the input devices) should be positioned on the same isothermal contour to reduce thermal mismatch resulting in unwanted offset voltages. Therefore, in a single operational amplifier, devices which require critical matching are positioned equidistant from the power devices and from the layout's axis of symmetry.

This type of positioning has also been employed in the layout of a dual operational amplifier. That is, each cell or channel is the mirror image of its adjacent cell and shares the same axis of symmetry. In this manner, not only do the critical devices of each cell reside on the same isothermal contour created by its associated power devices, but they also reside on the same isothermal contour created by power devices in the other cell. If the power devices of both cells are simultaneously generating power, the resultant isothermal lines are created by the superposition. Even in this case, the critical devices reside on the same isothermal contour. Thus, the dual operational amplifier may be characterized as having channel-to-channel symmetry.

Unfortunately, standard configurations for quad-operational amplifiers are such that each cell or channel occupies one quadrant of a four quadrant layout. While symmetry is maintained in each cell, channel-to-channel symmetry is lost producing unwanted offset voltages and reducing desired channel separation.

Furthermore, currently manufactured quad-operational amplifiers are not suitable for packaging in small outline integrated circuit packages without substantial modifications, some of which result in significant disadvantages.

SUMMARY OF THE INVENTION

It is an object of the present invention to provide an improved quad-operational amplifier integrated circuit.

It is a further object of the present invention to provide a quad-operational amplifier characterized by channel-to-channel symmetry.

It is a still further object of the present invention to provide a quad-operational amplifier having improved channel separation.

It is yet another object of the present invention to provide a quad-operational amplifier suitable for packaging in a small outline integrated circuit (SOIC) package.

According to a broad aspect of the present invention there is provided an improved operational amplifier circuit of the type wherein a plurality operational amplifier cells, each including power devices and devices which must be matched, are implemented on a single semiconductor die. First, second, third and fourth operational amplifier cells are arranged in a linear array on the die such that the power devices and the devices which must be matched are symmetrically positioned about the same axis of symmetry.

According to a further aspect of the present invention there is provided an improved method of laying out a quad-operational amplifier circuit on a single semiconductor die. The circuit includes first, second, third and fourth operational amplifier cells each including power devices and devices which must be critically matched. The first, second, third and fourth cells on said semiconductor die are positioned in a linear array such that the devices which must be critically matched are symmetrically disposed about the same axis of symmetry with respect to the power devices.

The above and other objects, features and advantages of the present invention will be more clearly understood from the following detailed description taken in conjunction with the accompanying drawings, in which

BRIEF DESCRIPTION OF THE DRAWINGS

FIG. 3 is a plan view of the layout of another prior art quad-operational amplifier; and FIG. 4 is a plan view of the inventive quad-operational amplifier.

DESCRIPTION OF THE PREFERRED EMBODIMENT

Figure 1:
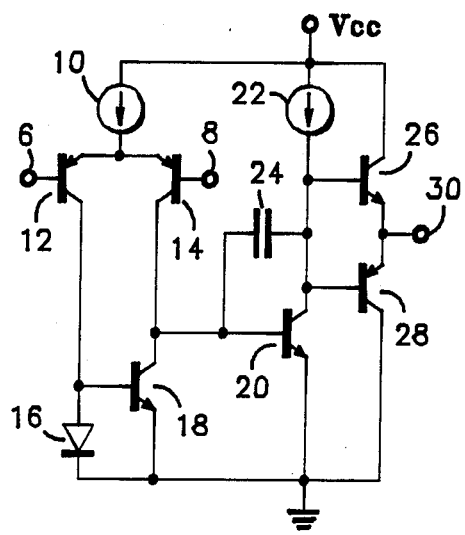
FIG. 1 is a schematic diagram of an operational amplifier in accordance with the prior art.

FIG. 1 is a schematic diagram of a basic operational amplifier which may comprise a single cell of either the prior art quad-operational amplifiers or the inventive quad-operational amplifier. An input stage includes current source 10, first and second input PNP transistors 12 and 14 which should be matched to avoid offset voltages, and a current mirror circuit including diode 16 and NPN transistor 18. As can be seen, current source 10 is coupled between a source of supply voltage $V_{CC}$ and the emitters of transistors 12 and 14. The collector of transistor 12 is coupled to the anode of diode 16 and to the base of transistor 18, and the collector of transistor 14 is coupled to the collector of transistor 18 which forms the output of the input stage. Both the cathode of diode 16 and the emitter of transistor 18 are coupled to a second source of supply voltage (e.g. ground). The collector of transistor 18 is coupled to an NPN gain transistor 20 having an emitter coupled to ground, a collector coupled via current source 22 to $V_{CC}$, and having a compensation capacitor 24 coupled across its base and collector terminals.

The amplifier's output stage comprises NPN transistor 26 and PNP transistor 28 each having a base terminal coupled to the collector of transistor 20. The collector of transistor 26 is coupled to $V_{CC}$, and the collector of transistor 28 is coupled to the second source of supply. The emitters of both transistors 26 and 28 are coupled to output terminal 30.

The amplifier shown in FIG. 1 operates in a well known manner. For example, if the voltage at input terminal 6 coupled to the base of transistor 12 is greater than the voltage appearing at input terminal 8 coupled to the base of transistor 14, transistor 14 becomes more conductive than transistor 12 and, through the action of the current mirror circuit, causes the voltage at the collector of transistor 18 to increase. This in turn causes transistor 20 to turn on placing a low voltage at the bases of transistors 26 and 28. Under these conditions, transistor 26 remains off and transistor 28 turns on causing the voltage at output terminal 30 to go low. If, on the other hand, the voltage at input terminal 8 is higher than that at input terminal 6, transistor 12 will be rendered more conductive than transistor 14 which causes the voltage at the collector of transistor 18 to go low. Transistor 20 remains off causing a high voltage appear at the bases of transistors 26 and 28. This being the case, transistor 26 turns on while transistor 28 remains off. Thus, a high voltage will appear at output terminal 30.

Figure 2:
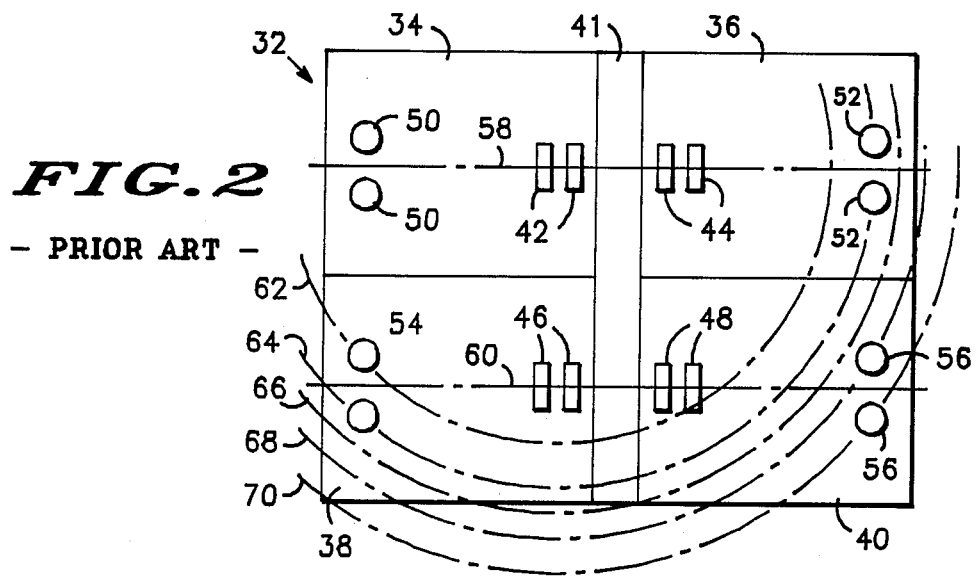
FIG. 2 is a plan view of the layout of a prior art quad-operational amplifier.

FIG. 2 illustrates a quad-operational amplifier integrated circuit layout 32 comprised of four operational amplifier cells or channels 34, 36, 38, and 40. Each cell includes power devices such as transistors 26 and 28 in FIG. 1 and devices which must be critically matched such as input transistors 12 and 14 in FIG. 1. Thus, amplifiers 34, 36, 38 and 40 include power devices 42, 44, 46 and 48 respectively and the critically matched devices 50, 52, 54, and 56 respectively.

To simplify the explanation of the problem associated with the layout in FIG. 2, it will be assumed that only power devices 42 are dissipating power while power devices 44, 46 and 48 are inactive. As a result, a plurality of isothermal contours 62, 64, 66, 68 and 70 are created which are generally circular having a center occupied by power devices 42. It can be seen that cells 34 and 36 have the same axis of symmetry 58, and that cells 38 and 40 have the same axis of symmetry 60. Since, cells 34 and 36 share a common axis of symmetry, devices 52 which must be critically matched reside on the same isothermal contour 64. That is, each device 52 is equidistant from axis 58 and also from power devices 42. Unfortunately, the devices which must be critically matched in cells 38 and 40 (i.e. devices 54 and 56) are not symmetric with respect to power devices 42 and therefore reside on different isothermal contours. For example, devices 54 reside on contours 62 and 64, while devices 56 reside on contours 60 and 70. Therefore, amplifiers 38 and 40 may suffer from the generation of undesired offset voltages induced by power devices 42. Additionally, this layout is not suitable for housing in small outline packages which generally require a higher aspect ratio (i.e. length/width).

In an effort to reduce this problem, a quad-amplifier layout of the type shown in FIG. 3 was developed. This quad amplifier layout includes individual amplifier cells 72, 74, 76 and 78. Cells 72, 74, 76 and 78 each include power devices 80, 82, 84 and 86 respectively and critical devices 88, 90, 92 and 94 respectively. The intent of this configuration is to reduce the variance in temperature experienced by critical devices in each cell by placing all power devices near the center of the quad layout. While this proves helpful, it does not entirely solve the problem and is likewise not suitable for housing in small outline packages. For example, if we assume that power devices 80 are the only ones dissipating power, it can be seen that critical devices 90 in cell 74 still reside on different isothermal contours 96 and 98 although the temperature differential has been somewhat reduced over that shown in conjunction with the layout of FIG. 2.

FIG. 4 illustrates the layout of the quad operational amplifier in accordance with the present invention. It comprises individual operational amplifier cells 100, 102, 104 and 106, each of which is symmetrically implemented along an axis 108. Amplifiers 100, 102, 104 and 106 include power devices 110, 112, 114 and 116 respectively and critical devices 118, 120, 122, and 124 respectively. The common biasing circuitry may be placed in channel 126.

As can be seen, cell 102 is a mirror image of cell 104, cell 100 is a mirror image of cell 102, and cell 106 is the mirror image of cell 104. The critical devices in each cell are equidistant from the axis of symmetry 108 and are also equidistant from any and all of the power devices. Thus, the critical devices in each cell will always reside on the same isothermal contour.

In addition, the axis of symmetry 108 may be made to coincide with a stress axis on the semiconductor die on which the quad amplifier is implemented. It is well known that semiconductor die may be mounted on a header by heating and then cooling. Since the thermal coefficients of the die and the header are different, certain mechanical stresses are exerted on the die. The stress gradients are also generally symmetric about an axis which may be determined from the crystal orientation of the semiconductor material. Therefore, by making the axis of symmetry 108 coincide with the stress axis, the critical devices in each amplifier cell will be subject to the same stress thus acheiving a more perfect match.

The layout shown in FIG. 4 has other significant advantages. First, power sources may be delivered via separate supply pads 128 and 130 to each channel on separate metal conductors 132, 134, 136, 138, 140, 142, 144 and 146. No crossunders are required, there is no need to share power lines, nor are there any common grounds. Furthermore, it is no longer as important to position the critical devices far from the power devices. Finally, the layout shown on FIG. 4 is suitable for use in conjunction with small outline integrated surface packages.

The above description is given by way of example only. Changes in form and details may be made by one skilled in the art with out departing from the scope of the invention as defined by the appended claims.

We claim:

1. An improved operational amplifier circuit of the type wherein a plurality operational amplifier cells, each including power devices and devices which must be matched, are implemented on a single semiconductor die, the improvement comprising first, second, third and fourth operational amplifier cells arranged in a linear array on said die such that the power devices and the devices which must be matched are symmetrically positioned about the same axis of symmetry.

2. A circuit according to claim 1 wherein each of said first, second, third and fourth cells is the mirror image of an adjacent one of the remainder of said first, second, third and fourth cells.

3. A circuit according to claim 1 wherein said axis of symmetry is colinear with a stress axis of said die.

4. An improved method of laying out a quad operational amplifier circuit on a single semiconductor die, the circuit comprising first, second, third and fourth operational amplifier cells each including power devices and devices which must be critically matched, the improvement comprising:

positioning said first, second, third and fourth cells on said semiconductor die in a linear array such that said devices which must be critically matched care symmetrically disposed about the same axis of symmetry with respect to said power devices.

5. A method according to claim 4 further including the step of choosing the axis of symmetry to be colinear with a stress axis of said die.

* * * * *